US010079150B2

(12) United States Patent
Neumann, Jr. et al.

(10) Patent No.: US 10,079,150 B2
(45) Date of Patent: Sep. 18, 2018

(54) METHOD AND APPARATUS FOR DRY GAS PHASE CHEMICALLY ETCHING A STRUCTURE (71) Applicant: SPTS Technologies Limited, Newport (GB)

(72) Inventors: John Joseph Neumann, Jr., Breinigsville, PA (US); Kyle Stanton Lebouitz, Bethlehem, PA (US)

(73) Assignee: SPTS Technologies Limited, Newport (GB)

( * ) Notice: Subject to any disclaimer, the term of this patent is extended or adjusted under 35 U.S.C. 154(b) by 160 days.

(21) Appl. No.: 14/807,399

(22) Filed: Jul. 23, 2015

(65) Prior Publication Data
US 2017/0025282 A1 Jan. 26, 2017

(51) Int. Cl.
*H01L 21/302* (2006.01)
*H01L 21/306* (2006.01)
(Continued)

(52) U.S. Cl.
CPC .... *H01L 21/30604* (2013.01); *H01L 21/0212* (2013.01); *H01L 21/3065* (2013.01);
(Continued)

(58) Field of Classification Search
CPC .......... H01L 21/31116; H01L 21/0212; H01L 21/02274; H01L 21/30621
(Continued)

(56) References Cited

U.S. PATENT DOCUMENTS 6,290,684 B1 9/2001 Herrick
6,736,987 B1 5/2004 Cho
(Continued)

FOREIGN PATENT DOCUMENTS

GB 2473851 A 3/2001
JP H07193055 A 7/1995
(Continued)

OTHER PUBLICATIONS

Patrick B. Chu, et al., "Controlled Pulse-Etching With Xenon Difluoride," Transducers '97, 1997 International Conference on Solid-State Sensors and Actuators, Chicago, IL, Jun. 16-19, 1997, pp. 665-668.
(Continued)

*Primary Examiner* — Binh X Tran
(74) *Attorney, Agent, or Firm* — McNees Wallace & Nurick LLC (57) ABSTRACT

According to the invention there is provided a method of dry gas phase chemically etching a structure comprising the steps of: positioning the structure in an etch chamber, the structure comprising a first material and a second material, wherein the first material is selected from silicon, molybdenum, germanium, SiGe and tungsten, the second material is silicon dioxide or silicon nitride, and at least one surface of the first material is exposed so as to be contactable by a gas phase chemical etchant; etching the first material with a noble gas fluoride or halogen fluoride gas phase chemical etchant; and exposing the etch chamber to water vapour so that the step of etching the first material is performed in the presence of water vapour.

17 Claims, 5 Drawing Sheets

(51) Int. Cl.
*H01L 21/311* (2006.01)
*H01L 21/02* (2006.01)
*H01L 21/3065* (2006.01)
*H01L 21/3213* (2006.01)
*H01L 21/308* (2006.01)
*H01L 21/67* (2006.01)

(52) U.S. Cl.
CPC .... *H01L 21/3081* (2013.01); *H01L 21/31116* (2013.01); *H01L 21/32135* (2013.01); *H01L 21/67069* (2013.01)

(58) Field of Classification Search
USPC .................................. 438/719, 720, 734, 742
See application file for complete search history.

(56) References Cited

U.S. PATENT DOCUMENTS

| | | | |
|---|---|---|---|
| 6,913,653 B2 * | 7/2005 | Kanayama | B01D 11/0488 134/2 |
| 6,939,409 B2 | 9/2005 | Kanayama et al. | |
| 7,027,202 B1 * | 4/2006 | Hunter | G02B 26/0808 359/231 |
| 7,041,224 B2 | 5/2006 | Patel et al. | |
| 2002/0195423 A1 * | 12/2002 | Patel | B81C 1/00476 216/73 |
| 2004/0113097 A1 * | 6/2004 | Marchman | H01J 37/3056 250/492.2 |
| 2005/0109733 A1 * | 5/2005 | Kanayama | B01D 11/0488 216/59 |
| 2008/0035607 A1 * | 2/2008 | O'Hara | B01D 7/00 216/63 |
| 2009/0074646 A1 | 3/2009 | Sasagawa et al. | |
| 2012/0100470 A1 * | 4/2012 | Nozawa | G03F 1/50 430/5 |

FOREIGN PATENT DOCUMENTS

| | | |
|---|---|---|
| JP | H10209088 A | 8/1998 |
| WO | 2011006895 A1 | 1/2011 |

OTHER PUBLICATIONS

Makoto Saito, et al., "Low Temperature Plasmaless Etching of Silicon Dioxide Film Using Chlorine Trifluoride Gas With Water Vapor," Journal of the Electrochemical Society, 147 (12) (2000), pp. 4630-4632.

* cited by examiner

METHOD AND APPARATUS FOR DRY GAS PHASE CHEMICALLY ETCHING A STRUCTURE

FIELD OF THE INVENTION

This invention relates to a method of dry gas phase chemically etching a structure. The invention relates also to an apparatus for dry gas phase chemically etching a structure.

BACKGROUND OF THE INVENTION

This invention addresses a commonly encountered and long-standing problem in the field of semiconductor manufacture. The problem concerns structures which comprise both silicon and silicon dioxide or silicon nitride, where it is desired to etch the silicon portion of the structure. The silicon dioxide and/or silicon nitride portion(s) of the structure may be present as a mask or as a permanent structural feature in its own right. The problem is that the etch process used to etch the silicon also attacks the silicon dioxide and silicon nitride. It is highly desirable to improve the etch selectivity of silicon to silicon dioxide and silicon nitride, since improved selectivity of this kind reduces the thickness of silicon dioxide or silicon nitride which is required in order to successfully withstand the silicon etch process. This in turn reduces cost and also provides for design flexibility. Selectivity is herein defined as the ratio of the amount of target material (for example, silicon) etched to the amount that the silicon dioxide and/or silicon nitride is etched. Various proposals have been made in order to improve the etch selectivity by introducing various gases at various points in the etch process. U.S. Pat. No. 6,290,864 proposes the use of an admixture of an etchant and a non-etchant such as helium. GB2473851 discloses the use of hydrogen and U.S. Pat. No. 7,041,224 discloses the use of hydrogen and/or oxygen, in both cases used as part of an admixture with an etchant. WO2011/006895 proposes the use of oxygen and/or an oxidising gas such as nitrous oxide, ozone or nitrogen dioxide at various stages in the etching process. These oxidising gases may require additional heat to be effective.

SUMMARY OF THE INVENTION

The present invention, in at least some of its embodiments, provides a method of dry gas phase chemically etching a structure with improved selectivity. It is understood that dry gas phase chemical etching refers to etching with a gas phase chemical etchant which does not require the presence of a plasma or another highly energetic way of dissociating the etchant in order for etching to proceed. It is also understood that the term "gas phase" includes reference to a vapour phase species or a sublimed species which is present in the gaseous phase.

According to the first aspect of the invention there is provided a method of dry gas phase chemically etching a structure comprising the steps of:

positioning the structure in an etch chamber, the structure comprising a first material and a second material, wherein the first material is selected from silicon, molybdenum, germanium, SiGe and tungsten, the second material is silicon dioxide or silicon nitride, and at least one surface of the first material is exposed so as to be contactable by a gas phase chemical etchant; and etching the first material with a noble gas fluoride or halogen fluoride gas phase chemical etchant;

the method further comprising the step of exposing the etch chamber to water vapour so that the step of etching the first material is performed in the presence of water vapour.

Common knowledge in the art suggests that the presence of moisture in an etch chamber during etching with a noble gas fluoride or halogen fluoride etchant will cause the formation of HF which in turn will etch $SiO_2$. U.S. Pat. No. 6,939,409 provides an example of this received wisdom. It would be expected that this would result in an inferior etch selectivity of silicon to silicon dioxide. Silicon nitride is also affected by HF, and so it would be expected that the presence of moisture would also result in an inferior etch selectivity of silicon to silicon nitride. Therefore, it is highly surprising that the present invention can give rise to excellent and improved etch selectivity.

The step of exposing the chamber to water vapour may comprise introducing water vapour into the etch chamber and then removing water vapour from the etch chamber prior to the step of etching the first material.

The steps of introducing water vapour into the etch chamber, removing water vapour from the etch chamber and etching the substrate may be repeated cyclically. In these embodiments, the gas phase chemical etchant may be removed from the etch chamber after the step of etching the first material and prior to the subsequent step of exposing the etch chamber to water vapour. An initial step of etching the first material with a noble gas fluoride or halogen fluoride gas phase etchant may be performed prior to the cyclical repetition of the steps of introducing water vapour into the etch chamber, removing water vapour from the etch chamber and etching the substrate.

The step of exposing the etch chamber to water vapour may comprise introducing water vapour into the etch chamber at the same time as gas phase chemical etchant is introduced into the etch chamber. The gas phase chemical etchant and the water vapour may be continuously flowed into the etch chamber. Alternatively, the gas phase chemical etchant and the water vapour may be introduced into the etch chamber at the same time in a series of pulses.

The gas phase chemical etchant and the water vapour may be separately introduced into the etch chamber. This may be achieved through the use of separate gas lines and gas inlets for the gas phase chemical etchant and the water vapour. Alternatively, the gas phase chemical etchant and the water vapour may be mixed together prior to their introduction into the etch chamber. These methodologies may be used as part of a continuous flow or a pulsed method of exposing the etch chamber to water vapour.

Combinations of the above described methods for exposing the chamber to water vapour may be utilised in a single etching process.

The partial pressure of water vapour in the etch chamber may be less than the partial pressure of gas phase chemical etchant during the step of etching the first material in the etch chamber. The ratio of the partial pressures of water vapour in the etch chamber to the partial pressure of gas phase chemical etchant in the etch chamber may be less than 0.5:1 during the step of etching the first material.

The chemical etchant may be $XeF_2$. Alternatively, the chemical etchant may be $XeF_4$, $XeF_6$, $KrF_2$, $ClF_3$, $BrF_3$ or $IF_5$.

The step of exposing the etch chamber to water vapour may comprise introducing water vapour into the etch chamber at a pressure of at least 5 Torr (667 Pa). The water vapour may be at a pressure of at least 10 Torr (1333 Pa). The water vapour may be introduced into the etch chamber at a pressure of about 12 Torr (1600 Pa).

The water vapour may be introduced into the etch chamber at a temperature of less than 30° C. The water vapour may be at room temperature or slightly above room temperature (e.g., 5° C. or less above room temperature). In general, it is not necessary that water vapour at elevated temperatures is used.

The etch chamber may be exposed to water vapour for less than 20 seconds.

The structure may be chemically etched with a selectivity to etching of the first material to the second material of at least 2,500, preferably at least 4,000, more preferably at least 10,000, and most preferably at least 20,000. In these embodiments, the first material may be silicon. The second material may be silicon dioxide.

Where the second material is silicon nitride, the structure may be chemically etched with a selectivity to etching of the first material to the second material of at least 6000. The first material may be silicon.

The skilled reader will appreciate that the precise composition of a silicon nitride sample can vary in dependence on various factors such as deposition conditions. Silicon nitride can be described as $Si_xN_y$ where x and y are not fixed and are typically close to 3 and 4, respectively.

Silicon dioxide and silicon nitride present on the structure may be produced by any suitable technique such as CVD (chemical vapour deposition) or physical deposition methods. Thermal oxidation of silicon, low pressure CVD (LP-CVD) or plasma enhanced CVD (PECVD) may be used. Silicon dioxide and silicon nitride may be present as films, which may be thin films.

All combinations of the first and second materials are within the scope of the invention.

According to a second aspect of the invention there is provided a structure and an apparatus for dry gas phase chemical etching of the structure in a method of the first aspect of the invention, wherein the apparatus comprises:
an etch chamber in which the structure is positioned;
a first source of a noble gas fluoride or halogen fluoride gas phase chemical etchant;
a second source containing a volume of water; and
a gas delivery and removal system comprising a controller which allows i) the etch chamber to be exposed to water vapour supplied from the second source and ii) the structure to be etched with the gas phase chemical etchant supplied from the first source in the presence of water vapour;
and the structure comprises a first material and a second material, wherein the first material is selected from silicon, molybdenum, germanium, SiGe and tungsten, the second material is silicon dioxide or silicon nitride, and at least one surface of the first material is exposed so as to be contactable by the gas phase chemical etchant.

It is understood that any feature described in relation to the first aspect of the invention is also described in relation to the second aspect of the invention and vice versa.

Whilst the invention has been described above, it extends to any inventive combination of the features set out above, or in the following description, drawings or claims.

BRIEF DESCRIPTION OF THE DRAWINGS

Embodiments of apparatus and methods in accordance with the invention will now be described with reference to the accompanying drawings, in which.

DETAILED DESCRIPTION

Figure 1:
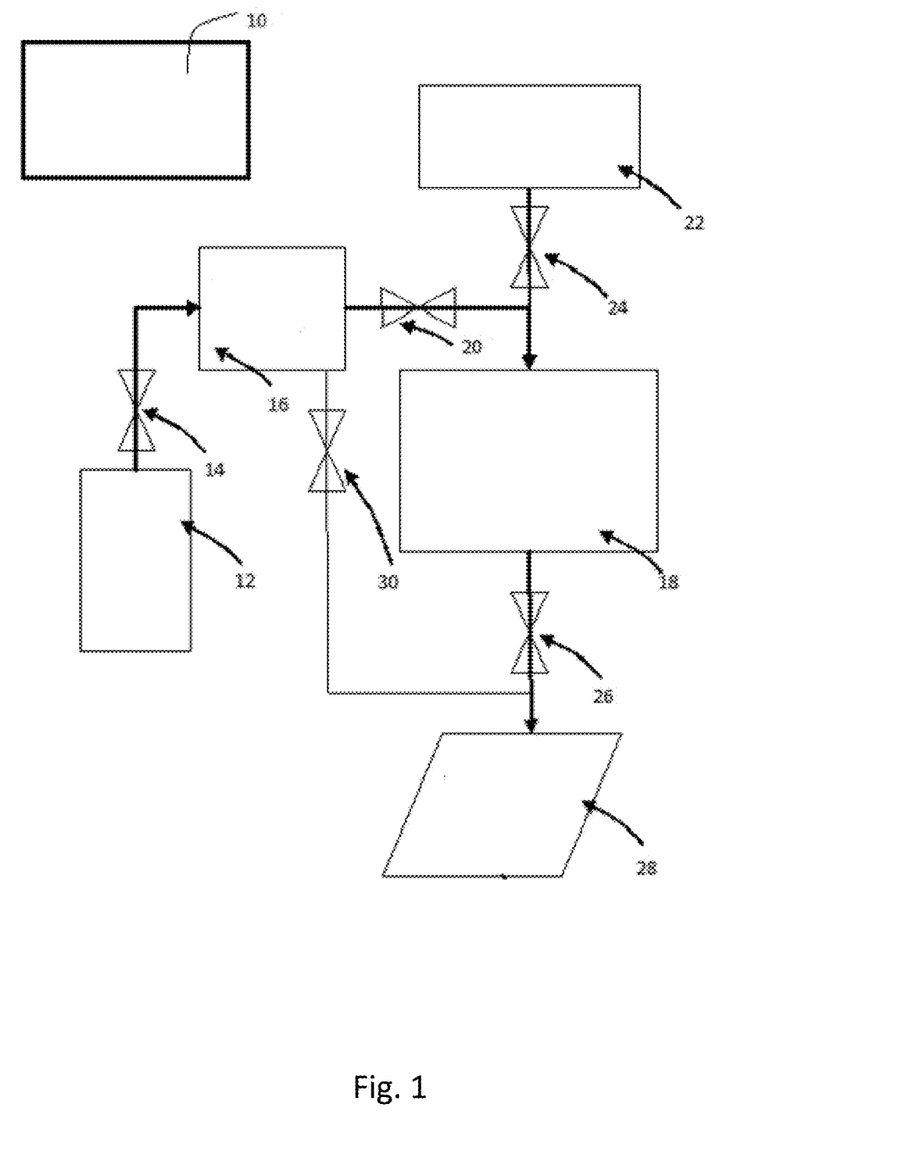
FIG. 1 is a schematic diagram showing a first apparatus of the invention.

FIG. 1 shows an apparatus for gas phase chemically etching a structure (not shown), the apparatus comprising a gas phase etchant source 12. In the present example, the gas phase etchant is xenon difluoride, and the chemical etchant source 12 contains gas phase xenon difluoride which is a sublimate of solid xenon difluoride which is also present in the source 12. Other noble gas fluorides and halogen fluorides may be contemplated. A valve 14 may be opened and closed to allow an intermediate chamber 16 (commonly called an expansion chamber) to be filled up to a desired pressure of xenon difluoride. The structure to be etched (not shown) is loaded into etch chamber 18. The loading of the structure can be performed using techniques and apparatus which are well understood in the art. A valve 20 can be opened and closed so as to control the introduction of the gas phase chemical etchant into the chamber 18 in order to etch the structure. The apparatus further comprises a reservoir 22 which is partially filled with water. A valve 24 can be opened to allow water vapour to enter the etch chamber 18. Any air present in the reservoir 22 is previously evacuated so that the gaseous atmosphere in the reservoir 22 consists entirely of water vapour. An exhaust line having a valve 26 is connected to a vacuum pump 28. This enables gases to be pumped away from the etch chamber 18. The apparatus comprises an auxiliary exhaust line having a valve 30 which enables the expansion chamber 16 to be evacuated by the vacuum pump 28. The apparatus further comprises a controller 10 which controls the operation of various elements of the apparatus, including valves 14, 20, 24, 26 & 30, in accordance with the invention. For presentational simplicity, interconnections between the controller 10 and the various controlled elements of the apparatus are not shown in FIG. 1. The controller may be of any suitable form such as a PC, PLC, or another microprocessor based device.

A method of operating the apparatus in accordance with the invention will now be described. The reservoir 22 is at room temperature. At room temperature, water vapour is present above the liquid $H_2O$ in the reservoir 22 at its vapour pressure of about 17 Torr. The valve 24 is opened to permit water vapour to flow into the etch chamber 18. Water evaporates from the liquid $H_2O$ present in the reservoir to maintain the room temperature pressure in the reservoir 22, and the pressure of water vapour in the etch chamber 18 increases to approach the vapour pressure of water as long as the valve 24 is open. The apparatus can be readily designed to that this process proceeds slowly enough (such as over a period of several seconds) that the valve 24 can be controlled by the controller 10 to shut off the supply of water vapour into the etch chamber 18 when a target water vapour pressure in the etch chamber 18 is achieved. It will be apparent that this target vapour pressure in the main chamber 18 may correspond to the full water vapour pressure, or a target pressure which is less than the full water vapour pressure might instead be attained. During the introduction of the water vapour into the chamber 18, the valve 26, together with the valve 20, is closed. After the etch chamber 18 has been exposed to the water vapour at the desired pressure for a desired time, the water vapour is pumped out of the main chamber 18 by opening the valve 26 until a practical base pressure in the etch chamber 18 is achieved. A typical residence time for water vapour in the main chamber 18 is a few seconds, and a typical practical base pressure in the etch chamber after removal of the water vapour is about 0.3 Torr. The removal of the water vapour from the etch chamber 18 completes a water vapour purge cycle.

An etch cycle is then formed. The valve 14 is opened to allow xenon difluoride vapour to fill the expansion chamber 16. The valve 14 is then closed. The etch chamber 18 containing the structure to be etched is at a desired base pressure (such as 0.3 Torr) due to pumping by the vacuum pump 28 through the valve 26. The valve 26 is then closed, the valve 20 is opened, and xenon difluoride gas flows from the expansion chamber 16 into the etch chamber 18 for a desired amount of time. At the end of this desired amount of time, the valve 26 is opened to allow the vacuum pump 28 to pump down the etch chamber 18. This process may be performed with the valve 20 open so that the expansion chamber 16 is partially or completely evacuated. In this case, the expansion chamber 16 may be pumped down to a certain pressure, which may be less than 0.8 Torr. The valve 20 is then closed and the valve 30 is opened to fully evacuate the expansion chamber 16 to a desired base pressure. The desired base pressure may be about 0.3 Torr or lower. The valve 30 is then closed. This completes an etch cycle. The etch and water vapour cycles may be repeated in a cyclical manner until a desired amount of material has been etched from the structure in the etch chamber 18. The very first step performed in the process may be either of the etch cycle or the water vapour purge cycle. The apparatus is shown in FIG. 1 in schematic form only. The skilled reader will appreciate that there are various elements of chemical etching systems which are well known in the art, such as pressure sensors and other components, which would be present in the apparatus but which are not shown in FIG. 1.

Figure 2:
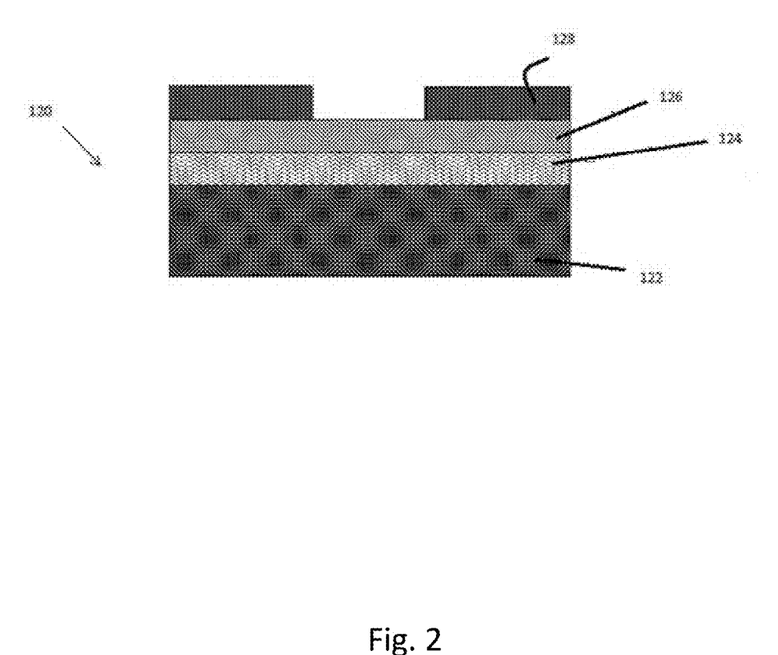
FIG. 2 is a cross-sectional view of a test wafer before etching.
Figure 3:
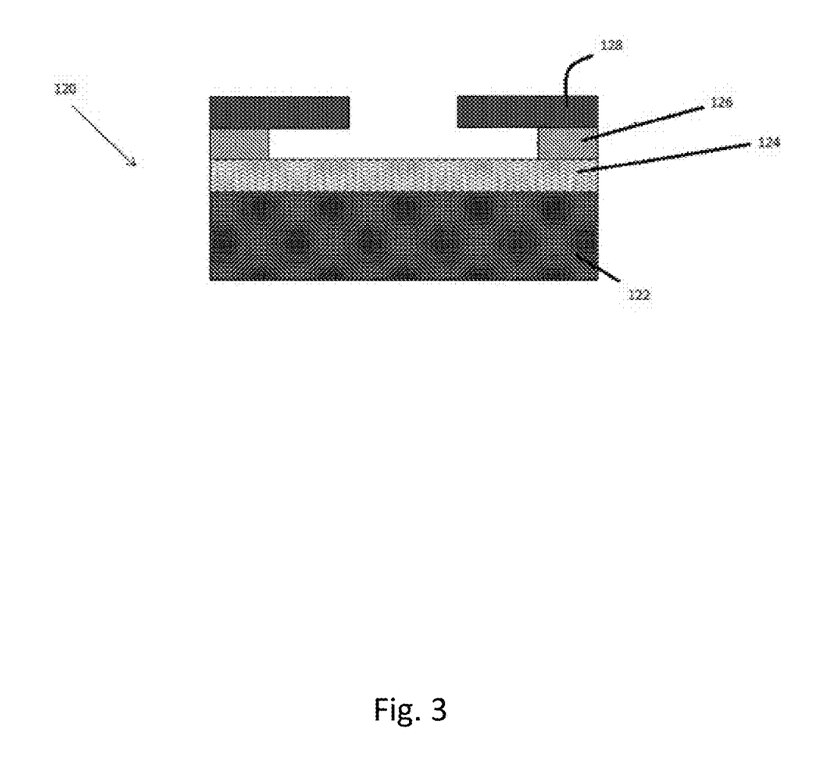
FIG. 3 is a cross-sectional view of a test wafer after etching.

A number of experiments were performed in which a test wafer containing silicon was etched. FIG. 2 shows a test wafer, depicted generally at 120, before etching. The wafer 120 comprises a silicon substrate 122 having a layer 124 of either silicon dioxide or silicon nitride thereon. More specifically, 1 micron thick silicon dioxide layers were grown thermally, and 0.3 micron thick stoichiometric $Si_xN_y$ layers were deposited by LPCVD. A 1 micron thick layer of LPCVD undoped polysilicon 126 was deposited on top of the silicon dioxide or silicon nitride layer 124. A 1 micron thick photoresist pattern 128 was formed on top of the polysilicon layer 126. FIG. 3 is representative of a test wafer 120 after chemical etching with xenon difluoride. Identical reference numerals to those used in FIG. 2 are used in FIG. 3 to denote identical features. An amount of silicon is etched underneath the photoresist 128. The extent of this amount of etched silicon is called the undercut. The undercut is measured, and also the remaining thickness of the silicon dioxide or silicon nitride layer 124 is measured. From these measurements, an etch selectivity can be calculated. The etch selectivity of silicon to silicon dioxide or silicon nitride is the ratio of the silicon etch undercut distance to the reduction in silicon dioxide or silicon nitride film thickness.

The results of the experiments together with some of the experimental parameters are shown in Table 1. In all the experiments, an etch chamber was used which was equipped with a quartz lid in order to minimise moisture variations and to allow for visual inspection of the etch process. The silicon wafer was retained in the etch chamber on a chuck. The chamber and chuck temperature was set at 24° C. Xenon difluoride was present in the expansion chamber at a pressure of 6 Torr for each etch cycle, and the etch chamber was pumped out to below 0.3 Torr between each cycle. If a purge was performed, the purge cycle comprised retaining the gas in the etch chamber for 5 seconds before pumping out the etch chamber to below 0.3 Torr. Each experiment comprised separate tests on wafers having a silicon dioxide layer and wafers having a silicon nitride layer.

TABLE 1

Results of Experiments on Silicon Wafers

| | Reference | $H_2O$ (12 torr) | Delay, No Purge | $N_2$ (12 torr) | $O_2$ (6 torr) | $O_2$ (12 torr) | $H_2$ (12 torr) |
|---|---|---|---|---|---|---|---|
| Experiment # | 1 | 2 | 3 | 4 | 5 | 6 | 7 |
| Purge/Delay Time (s) | None | 5 | 17 | 5 | 5 | 5 | 5 |
| Purge Gas | None | $H_2O$ | None | $N_2$ | $O_2$ | $O_2$ | $H_2$ |
| Purge Pressure (Torr) | None | 12 | None | 12 | 6 | 12 | 12 |
| Undercut (um) ($Si_xN_y/SiO_2$) | 16/17.5 | 11/15 | 19.5/19 | 21/19 | 17.5/20 | 18/19 | 15.5/17 |
| $Si_xN_y$ attack (Ang) | 433 | 13 | 471 | 470 | 317 | 313 | 546 |
| $SiO_2$ attack (Ang) | 127 | 30 | 152 | 135 | 142 | 113 | 96 |
| $Si_xN_y$ Selectivity | 370 | 8462 | 414 | 447 | 552 | 575 | 284 |
| $SiO_2$ Selectivity | 1378 | 5000 | 1250 | 1407 | 1408 | 1681 | 1771 |

EXPERIMENT #1

Reference Experiment

In experiment #1, an etch was run without any purges in between etch cycles.

The process therefore can be described as essentially comprising the exposure of the wafer to a series of pulses of xenon difluoride. This is a typical prior art etch process, and it resulted in a silicon nitride selectivity of 370 and a silicon dioxide selectivity of 1378.

EXPERIMENT #2

Water Vapour Purge

A purge with water vapour was employed after each pulse of xenon difluoride. The water vapour pressure in the etch chamber during the water vapour purge was 12 Torr and this was held for 5 seconds before pumping out the etch chamber to less than 0.3 Torr. The addition of each water vapour purge added about 17 additional seconds to the process, due to the process of filling the etch chamber with water, maintaining the water vapour pressure, and pumping out. The resulting selectivity shows a dramatic increase compared to the reference experiment. With silicon dioxide, there is approximately a 350% increase in selectivity, whereas with silicon nitride, selectivity is increased by approximately 2000%. It was noted that the undercut etch distance of silicon dropped by approximately 25% in comparison to the reference experiment. Without wishing to be bound by any particular theory or conjecture, it is believed the xenon difluoride may be reacting with the water which reduces the amount of xenon difluoride available for etching the silicon. There are many applications where maximising the selectivity of silicon to silicon nitride and silicon dioxide is the most critical requirement and where this requirement is more important than the overall silicon etch rate. Furthermore, it is possible to vary the vapour pressure of water in the chamber to provide a means of tailoring the silicon etch rate and selectivity as needed. For example, a lower vapour pressure of water may be used with an intention to increase the silicon etch rate. Another possibility is to utilise a different etch sequence in which a water vapour purge is only performed after several etch pulses have been used. A further possibility is to use a continuous flow etch process where a xenon difluoride (or other etchant) flows for a certain period of time at a specified etch chamber pressure before the gas flow is stopped and the etch chamber evacuated. A pulse or flow of water vapour can then be introduced into the etch chamber at specified pressure for a specified time. This process of performing a continuous etch with an occasional stoppage to introduce water vapour can be repeated until the etch process has been completed.

EXPERIMENT #3-7

Comparison Experiments

A number of other experiments were performed as comparisons. In experiment #3, a 17 second delay was added prior to the etch steps. This experiment was otherwise identical to the reference experiment #1. The 17 second delay corresponds to the total time taken to perform the water vapour purge step. In comparison to the reference experiment #1, the selectivity did not change significantly, although the total amount of silicon etched increased by approximately 10%. This may be explained by cooling of the wafer in between the etch cycles, since lower temperatures are known to increase the etch rate for xenon difluoride etching of silicon. Experiment #3 shows that simply introducing a time lag between etch cycles is not a driver for improved etch selectivity.

Experiment #4 followed the same procedures as experiment #2, except that purges were performed using nitrogen gas instead of water vapour. The nitrogen gas was introduced to a pressure of 12 Torr which is identical to the water vapour pressure present in the etch chamber in experiment #2. The resulting selectivity was similar to the reference experiment #1, although the silicon etch rate appeared to increase. In fact, there is some evidence to suggest that the etch rate is greater than that obtained in experiment #3. This would be consistent with the atmosphere of nitrogen providing further cooling of the wafer between etch cycles which would be expected to increase the etch rate. Experiment #4 demonstrates that improved selectivity is not simply as a result of a purge of gas at a pressure of 12 Torr between etch cycles.

Experiments #5 and 6 used oxygen gas in place of water vapour. The purpose of these experiments is to investigate whether oxygen is a prime contributor to increased selectivity. Oxygen pressures of both 6 and 12 Torr were used to test if the same number of oxygen atoms or the same number of moles of $O_2$ would explain the improved selectivity. However, in both cases there appears to be only a relatively modest increase of no more than 55% in the observed selectivities, in comparison to the 350% and 2000% improvements observed using water vapour purges. The silicon etch rate appears to be at least as fast as the reference etch.

Experiment #7 used a molecular hydrogen gas purge to see if hydrogen is the primary source of improved selectivity. In this instance, 12 Torr of $H_2$ was used between etch cycles. The selectivity appears to worsen for silicon nitride and improve slightly (29% increase) for silicon dioxide. The silicon etch rate is approximately the same as with the reference etch.

The experiments demonstrate that the use of a water vapour purge between etch cycles can provide significant improvements to etch selectivity of silicon in comparison to silicon dioxide and silicon nitride. The improvements appear to be specifically linked to the use of water vapour. In particular, the benefits cannot be explained by the extra time that a water purge step delays the etch, the use per se of a purging gas at a certain pressure, or by either of the atomic components of water acting individually.

Figure 4:
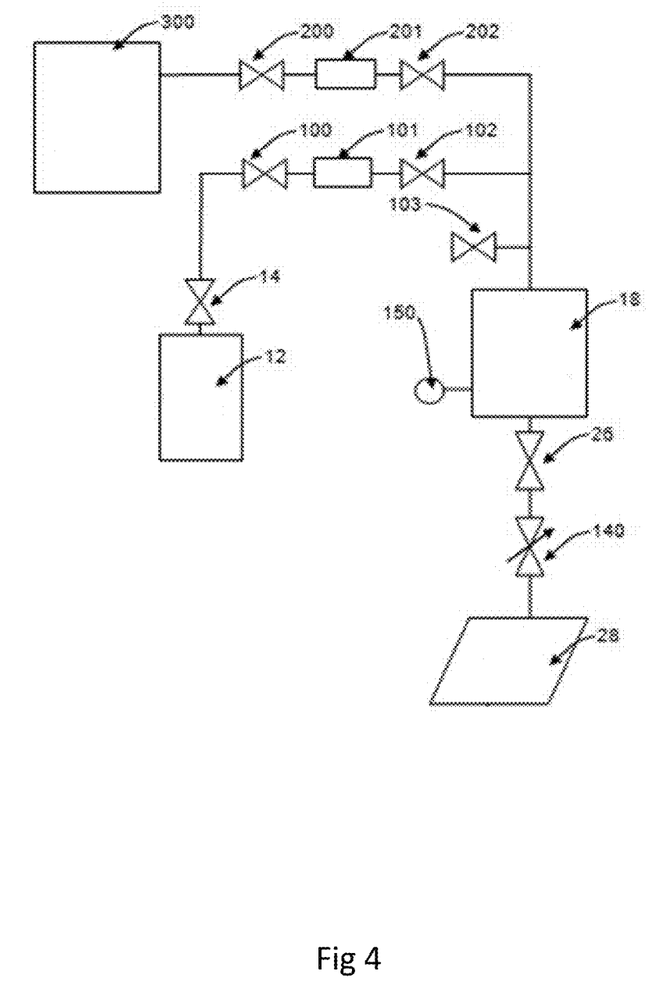
FIG. 4 is a schematic diagram showing a second, continuous flow, apparatus of the invention.

Further tests were conducted using a continuous flow etch system that allows water vapour to be flowed with the etch gas. The system is shown in FIG. 4 and contains a number of elements which are identical to elements shown in FIG. 1. Identical reference numerals to those used in FIG. 1 have been used in FIG. 4 to denote these shared elements. A wafer (or sample—not shown) is loaded into the etch chamber (18) which is also called the process chamber, and the chamber 18 is pumped down to a suitably low pressure, for example under 0.3 Torr, by opening both the main vacuum valve 26 and also a pressure control valve 140. The pressure in the chamber 18 is monitored by pressure sensor 150 which is used by the pressure control valve 140 to go to a setpoint. The pressure control valve 140 is sent a setpoint of the process etch pressure, for example 1 Torr. The pressure control valve may be of the type known as an APC (automatic pressure controller). Around the same time, $XeF_2$ and $H_2O$ vapour flows are started by opening the source valve 14 and control valves 100 and 102 for XeF2 and 200 and 202 for the water vapour. MFCs (mass flow controllers) 101 and 201 are set to the correct flow rates, for $XeF_2$ and $H_2O$. The source for the wafer vapour is a vacuum-tight reservoir, 300, which was previously partially filled with water, and the air evacuated. At room temperature, the space above the water is filled with $H_2O$ at its vapor pressure of about 17 Torr.

These flows are maintained for the duration of the etching process and the chamber pressure is maintained at pressure setpoint by the pressure control valve 140. At the end of the process, valves 100 and 102 are closed, and 200 and 202 are also closed if water vapour was used. The pressure control valve 140 is opened fully to pump out the chamber to a low pressure, for example under 0.3 Torr, and several pump/purge cycles are performed by closing the main vacuum valve 26, flowing the vent gas 103, which is typically $N_2$, up to a pressure such as 30 Torr, closing valve 103 and then opening valve 26 and repeating this process several times before removing the wafer.

A controller 10 such as a PC or PLC controller is provided such as 10 in FIG. 1 but not shown in FIG. 4 for presentational simplicity. There are typically additional valves (not shown) to pump out or purge out the MFCs 101 and 201. This continuous flow process can be integrated with pulsed systems. Increased water vapour flow rates can be attained by increasing the temperature of the water in the vessel 300. Alternatively, water vaporizers can be used.

Figure 5A:
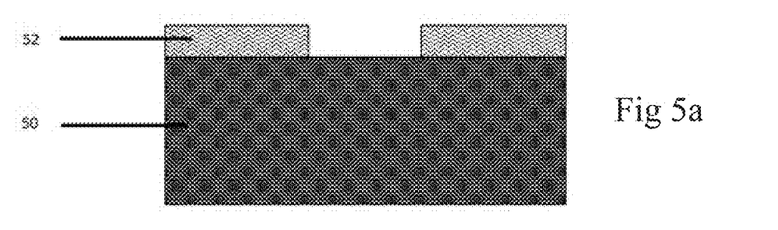
FIG. 5a is a cross-sectional view of a test wafer comprising thermally grown $SiO_2$ on silicon before etching.
Figure 5B:
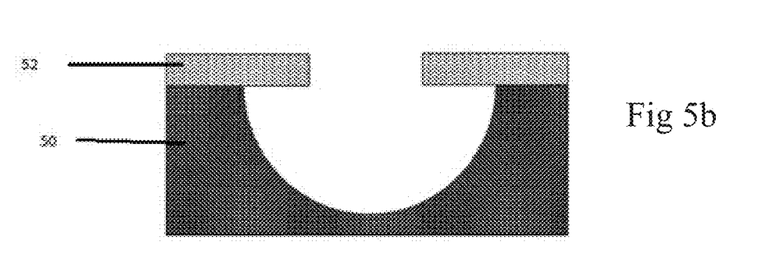
FIG. 5b is a cross-sectional view of a test wafer comprising thermally grown $SiO_2$ on silicon after etching.

As a more sensitive test for $SiO_2$ selectivity, another type of test wafer was run using continuous flow operation. This type of test wafer (XO) consists of a Si substrate 50 on which a 1 micron layer 52 of $SiO_2$ is thermally grown (FIG. 5a). The $SiO_2$ layer is then patterned with an array of 500-um square holes, with a 2500-um pitch, so approximately 4% of the wafer area is exposed Si. The $SiO_2$ film is on the surface of the wafer both before and after the etching, so more accurate thickness measurements are possible compared to the test wafers with the $SiO_2$ layer under the etched Si layer (the thickness measurements were averaged over 5 points along the diameter of the wafer to further increase the accuracy.) The etching process creates pits into the substrate (FIG. 5b), and the amount of etching can be characterized optically by the lateral etch (or "undercut"). The same machine setup and recipes were used for these test wafers as for the other types of test wafers.

TABLE 2

Continuous $XeF_2/H_2O$ flow experiments with $SiO_2$ mask (XO).

| Run No | $XeF_2$ flow (sccm) | $H_2O$ flow (sccm) | Chamber pressure (Torr) | Undercut (micron) | $SiO_2$ selectivity |
|---|---|---|---|---|---|
| 8 (ref) | 30 | 0 | 1 | 10 | 804 |
| 9 | 30 | 9.6 | 1 | 19 | 35185 |
| 10 | 30 | 9.6 | 1.32 | 17 | 27419 |

In Table 2 the conditions used to establish the benefits of using $H_2O$ with the etch gas can be seen with run number 8 acting as a reference point for a 210 seconds etch cycle. By adding 9.6 sccm of $H_2O$ to the reference $XeF_2$ gas flow of 30 sccm we can see a very substantial improvement, from 804:1 to >27,419:1, in $Si/SiO_2$ selectivity. Improvements in etch rate (undercut value) are also observed.

Without wishing to be bound by any particular theory or conjecture, it is believed that trace amounts of water combine with and neutralise free F radicals which are thought to be responsible for etching silicon dioxide and silicon nitride.

Numerous modifications and variants are possible. For example, it is possible to perform a water vapour purge step between only certain etch steps. Another possibility is to perform continuous flow etching for a desired period of time before stopping the continuous flow etch and performing a water vapour purge. A pulse or flow of water vapour may be introduced into the etch chamber at a specified pressure and for a specified time. After this, the continuous flow etch process can be resumed. The stopping of the continuous flow etching and the performance of a water vapour purge can be repeated as many times as is necessary. Although the invention has been exemplified in relation to the etching of sili1con using xenon difluoride, it is possible to utilise other etchants and to etch other materials. For example, materials such as molybdenum, germanium, SiGe and tungsten may be selectively etched using the invention. Other etchants such as $KrF_2$, $XeF_4$, $XeF_6$, $ClF_3$, $BrF_3$, and $IF_5$ may instead be used.

The invention claimed is:

1. A method of dry gas phase chemically etching a structure comprising the steps of:
    positioning the structure in an etch chamber, the structure comprising a first material and a second material, wherein the first material is selected from silicon, molybdenum, germanium, SiGe and tungsten, the second material is silicon dioxide or silicon nitride, and at least one surface of the first material is exposed so as to be contactable by a gas phase chemical etchant; and
    etching the first material with a noble gas fluoride or halogen fluoride gas phase chemical etchant;
    the method further comprising the step of exposing the etch chamber to water vapour so that the step of etching the first material is performed in the presence of water vapour.

2. A method according to claim 1 in which the chemical etchant is $XeF_2$.

3. A method according to claim 1 in which the partial pressure of water vapour in the etch chamber is less than the partial pressure of gas phase chemical etchant in the etch chamber during the step of etching the first material.

4. A method according to claim 1 in which the water vapour is introduced into the etch chamber at a temperature of less than 30° C.

5. A method according to claim 1 in which the water vapour is introduced into the etch chamber for less than 20 seconds.

6. A method according to claim 1 in which the step of exposing the etch chamber to water vapour comprises introducing water vapour into the etch chamber at a pressure of at least 5 Torr.

7. A method according to claim 6 in which the water vapour is introduced into the etch chamber at a pressure of at least 10 Torr.

8. A method according to claim 1 in which the structure is chemically etched with a selectivity to etching of the first material to the second material of at least 2,500.

9. A method according to claim 8 in which the second material is silicon nitride and the structure is chemically etched with a selectivity to etching of the first material to the second material of at least 6000.

10. A method according to claim 1 in which the step of exposing the chamber to water vapour comprises introducing water vapour into the etch chamber and then removing water vapour from the etch chamber prior to the step of etching the first material.

11. A method according to claim 10 in which the steps of introducing water vapour into the etch chamber, removing water vapour from the etch chamber and etching the substrate are repeated cyclically.

12. A method according to claim 11 in which an initial step of etching the first material with a noble gas fluoride or halogen fluoride gas phase etchant is performed prior to the cyclical repetition of the steps of introducing water vapour into the etch chamber, removing water vapour from the etch chamber and etching the substrate.

13. A method according to claim 1 in which the step of exposing the etch chamber to water vapour comprises introducing water vapour into the etch chamber at the same time as gas phase chemical etchant is introduced into the etch chamber.

14. A method according to claim 13 in which the gas phase chemical etchant and the water vapour are continuously flowed into the etch chamber.

15. A method according to claim 13 in which the gas phase chemical etchant and the water vapour are introduced into the etch chamber at the same time in a series of pulses.

16. A method according to claim 13 in which the gas phase chemical etchant and the water vapour are separately introduced into the etch chamber.

17. A method according to claim 13 in which the gas phase chemical etchant and the water vapour are mixed together prior to their introduction into the etch chamber.

* * * * *